(12) United States Patent
Yan et al.

(10) Patent No.: US 12,068,330 B2
(45) Date of Patent: Aug. 20, 2024

(54) TOUCH ARRAY SUBSTRATE AND MANUFACTURING METHOD THEREOF

(71) Applicant: Wuhan China Star Optoelectronics Technology Co., Ltd., Hubei (CN)

(72) Inventors: Yuan Yan, Hubei (CN); Yong Xu, Hubei (CN); Fei Ai, Hubei (CN); Dewei Song, Hubei (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 1056 days.

(21) Appl. No.: 16/966,116

(22) PCT Filed: Jan. 17, 2020

(86) PCT No.: PCT/CN2020/072587
§ 371 (c)(1),
(2) Date: Jul. 30, 2020

(87) PCT Pub. No.: WO2021/031532
PCT Pub. Date: Feb. 25, 2021

(65) Prior Publication Data
US 2023/0246036 A1    Aug. 3, 2023

(30) Foreign Application Priority Data

Aug. 20, 2019   (CN) .................. 201910768751.0

(51) Int. Cl.
| H01L 27/12 | (2006.01) |
| G06F 3/041 | (2006.01) |
| G06F 3/044 | (2006.01) |

(52) U.S. Cl.
CPC ............ *H01L 27/124* (2013.01); *G06F 3/041* (2013.01); *G06F 3/0412* (2013.01);
(Continued)

(58) Field of Classification Search
CPC ..... H01L 27/1288; H01L 27/124–1244; G03F 1/32; G03F 1/26; G03F 1/76–80;
(Continued)

(56) References Cited

U.S. PATENT DOCUMENTS

| 2016/0035752 | A1 | 2/2016 | Hong | |
| 2019/0179207 | A1* | 6/2019 | Lin | .................. G02F 1/134363 |
| 2019/0333945 | A1* | 10/2019 | Liu | ..................... G06F 3/04164 |

FOREIGN PATENT DOCUMENTS

| CN | 104330935 | 2/2015 |
| CN | 104716144 | 6/2015 |

(Continued)

*Primary Examiner* — Shaun M Campbell
*Assistant Examiner* — Aneta B Cieslewicz (57) ABSTRACT

A touch array substrate and a manufacturing method thereof, wherein in the touch array substrate, an active layer, an insulating layer, a pixel electrode layer, a metal layer, a planarization layer, and a common electrode layer are sequentially disposed on the buffer layer. The active layer includes a first region corresponding to a source electrode and a second region corresponding to a drain electrode. The pixel electrode layer includes a plurality of base layers. The metal layer is correspondingly disposed on the base layers. The metal layer includes a touch signal line, a data line, and a gate electrode. The common electrode layer includes a touch electrode, the source electrode, and the drain electrode.

13 Claims, 5 Drawing Sheets

(52) U.S. Cl.
CPC ........ G06F 3/04164 (2019.05); G06F 3/0443 (2019.05); H01L 27/1288 (2013.01); *G06F 2203/04103* (2013.01)

(58) Field of Classification Search
CPC .. G06F 3/0412; G06F 3/04164; G06F 3/0443; G06F 2203/04103; G06F 3/041–047
See application file for complete search history.

(56) References Cited

FOREIGN PATENT DOCUMENTS

| | | | |
|---|---|---|---|
| CN | 105514119 | 4/2016 | |
| CN | 107315296 | 11/2017 | |
| CN | 109037241 A | * 12/2018 | ......... H01L 27/1214 |
| CN | 110620118 | 12/2019 | |

* cited by examiner

TOUCH ARRAY SUBSTRATE AND MANUFACTURING METHOD THEREOF

RELATED APPLICATIONS

This application is a US national phase application based upon an International Application No. PCT/CN2020/072587, filed on Jan. 17, 2020, which claims priority to Chinese Patent Application No. 201910768751.0, entitled "TOUCH ARRAY SUBSTRATE AND MANUFACTURING METHOD THEREOF", filed on Aug. 20, 2019, the disclosure of which is incorporated herein by reference in its entirety.

FIELD AND BACKGROUND OF THE INVENTION

The present disclosure relates to display technologies, and particularly relates to a touch array substrate and a manufacturing method thereof.

With development of integrated touch display panels, people's demand for high resolutions is becoming increasingly higher. Therefore, refined active driving arrays (array substrates) coordinating with each pixel region to carry out deflection are needed.

However, manufacturing methods of touch integrated array substrates in the prior art are complicated, resulting in high production cost and long production period.

SUMMARY OF THE INVENTION

Embodiments of the present disclosure provides a touch array substrate and a manufacturing method to solve the technical problem of current touch array substrates having high production cost and long production periods.

An embodiment of the present disclosure provide a touch array substrate, which includes a substrate and a buffer layer disposed on the substrate, and the touch array substrate includes:

An active layer, which is disposed on the buffer layer. The active layer includes a first region corresponding to a source electrode of a thin film transistor and a second region corresponding to a drain electrode of the thin film transistor.

An insulating layer, which is disposed on the active layer and covers the active layer and the buffer layer.

A pixel electrode layer, which is disposed on the insulating layer. The pixel electrode layer includes a pixel electrode and a plurality of base layers disposed on a same layer as the pixel electrode.

A metal layer, which is correspondingly stacked on the plurality of base layers of the pixel electrode layer. The metal layer includes a touch signal line, a data line, a gate electrode, and a gate line.

A planarization layer, which is disposed on the metal layer and covers the metal layer, the pixel electrode, and the insulating layer.

A common electrode layer, which is disposed on the planarization layer. The common electrode layer includes a touch electrode, the source electrode, and the drain electrode. The touch electrode is connected to the touch signal line. An end of the source electrode is connected to the first region. Another end of the source electrode is connected to the data line. An end of the drain electrode is connected to the second region. Another end of the drain electrode is connected to the pixel electrode.

The gate electrode and the gate line are connected together and integrally formed. An extending direction of the gate line is perpendicular to an extending direction of the data line. The gate line and the data line are spaced apart.

Furthermore, the common electrode layer further includes a plurality of connection lines, and the gate line on each row is connected by the plurality of connection lines.

The plurality of base layers include a first base layer, a second base layer, and a third base layer. An extending direction of the first base layer is consistent with an extending direction of the touch signal line. An extending direction of the second base layer is consistent with an extending direction of the data line. An extending direction of the third base layer is consistent with an extending direction of the gate line.

The touch signal line is stacked on the first base layer. The data line is stacked on the second base layer. The gate line is stacked on the third base layer.

An embodiment of the present disclosure further provides a touch array substrate, which includes a substrate and a buffer layer disposed on the substrate, and the touch array substrate includes:

An active layer, which is disposed on the buffer layer. The active layer includes a first region corresponding to a source electrode of a thin film transistor and a second region corresponding to a drain electrode of the thin film transistor.

An insulating layer, which is disposed on the active layer and covers the active layer and the buffer layer.

A pixel electrode layer, which is disposed on the insulating layer. The pixel electrode layer includes a pixel electrode and a plurality of base layers disposed on a same layer as the pixel electrode.

A metal layer, which is correspondingly stacked on the plurality of base layers of the pixel electrode layer. The metal layer includes a touch signal line, a data line, a gate electrode, and a gate line.

A planarization layer, which is disposed on the metal layer and covers the metal layer, the pixel electrode, and the insulating layer.

A common electrode layer, which is disposed on the planarization layer. The common electrode layer includes a touch electrode, the source electrode, and the drain electrode. The touch electrode is connected to the touch signal line. An end of the source electrode is connected to the first region. Another end of the source electrode is connected to the data line. An end of the drain electrode is connected to the second region. Another end of the drain electrode is connected to the pixel electrode.

In the touch array substrate of the present disclosure, the gate electrode and the gate line are connected together and integrally formed. An extending direction of the gate line is perpendicular to an extending direction of the data line. The gate line and the data line are spaced apart.

Furthermore, the common electrode layer further includes a plurality of connection lines, and the gate line on each row is connected by the plurality of connection lines.

In the touch array substrate of the present disclosure, the plurality of base layers include a first base layer, a second base layer, and a third base layer. An extending direction of the first base layer is consistent with an extending direction of the touch signal line. An extending direction of the second base layer is consistent with an extending direction of the data line. An extending direction of the third base layer is consistent with an extending direction of the gate line.

The touch signal line is stacked on the first base layer. The data line is stacked on the second base layer. The gate line is stacked on the third base layer.

The present disclosure further relates to a manufacturing method of a touch array substrate, the manufacturing method includes following steps:

Providing a substrate.

Sequentially forming a buffer layer, an active layer and an insulating layer on the substrate. Furthermore, the active layer includes a first region corresponding to a source electrode of a thin film transistor and a second region corresponding to a drain electrode of the thin film transistor.

Sequentially forming a pixel electrode layer and a metal layer on the insulating layer, and using one photomask to perform a patterning process on the pixel electrode layer and the metal layer to form a pixel electrode, a touch signal line, a data line, and a gate electrode.

Forming a planarization layer on the metal layer.

Forming a patterned common electrode layer on the planarization layer to form a touch electrode, the source electrode, and the drain electrode. The touch electrode is connected to the touch signal line. An end of the source electrode is connected to the first region. Another end of the source electrode is connected to the data line. An end of the drain electrode is connected to the second region. Another end of the drain electrode is connected to the pixel electrode.

In the manufacturing method of the touch array substrate of the present disclosure, the step of sequentially forming the pixel electrode layer and the metal layer on the insulating layer, and using one photomask to perform a patterning process on the pixel electrode layer and the metal layer to form the pixel electrode, the touch signal line, the data line, and the gate electrode includes:

Sequentially forming the pixel electrode layer, the metal layer, and a first photoresist layer on the insulating layer.

Using a first halftone photomask to expose the first photoresist layer to light, and then performing development on the first photoresist layer to form a patterned first photoresist layer. The patterned first photoresist layer includes a first part corresponding to the gate electrode, the data line, and the touch signal line of the metal layer which are pending to be formed, a second part corresponding to the pixel electrode pending to be formed in the pixel electrode layer, and a first via hole corresponding to the first region and the second region of the active layer. A thickness of the first part is greater than a thickness of the second part.

Using the patterned first photoresist layer to act as a mask to etch the metal layer and the pixel electrode layer to form the gate electrode, the data line, and the touch signal line.

Performing a heavy doping process on the first region and the second region of the active layer through the first via hole.

Ashing the patterned first photoresist layer to make the first part thin and the second part disappear.

Etching an exposed metal layer to make the pixel electrode layer form into the pixel electrode.

Removing a remained first photoresist layer.

Performing a light doping process on the active layer.

In the manufacturing method of the touch array substrate of the present disclosure, the first halftone photomask includes a first light transmissive part and a second light transmissive part. A light transmittance rate of the first light transmissive part is greater than a light transmittance rate of the second light transmissive part, and the light transmittance rate of the first light transmissive part is 100%. The first light transmissive part corresponds to the first via hole pending to be formed, and the second light transmissive part corresponds to the pixel electrode pending to be formed in the pixel electrode layer.

In the manufacturing method of the touch array substrate of the present disclosure, before forming the patterned common electrode layer on the planarization layer includes following step:

Using hydrogen of the planarization layer to act as a hydrogen source to perform a hydrogenation process on the active layer correspondingly.

In the manufacturing method of the touch array substrate of the present disclosure, forming the patterned common electrode layer on the planarization layer includes following steps:

Forming a second photoresist layer on the planarization layer and performing a patterning process on the second photoresist layer. A patterned second photoresist layer includes a second via hole corresponding to the first region and the second region of the active layer, a third via hole corresponding to the pixel electrode, a fourth via hole corresponding to the touch signal line and the data line, a third part corresponding to a touch electrode, a source electrode, a drain electrode of the common electrode layer which are pending to be formed, and a fourth part corresponding to a part of the common electrode pending to be removed. A thickness of the third part is less than a thickness of the fourth part.

Using the patterned second photoresist layer to act as a mask to etch the planarization layer to form the second via hole, the third via hole, and the fourth via hole.

Ashing the second photoresist layer to remove the third part.

Forming the common electrode layer on the second photoresist layer.

Removing the second photoresist layer and the common electrode layer located on the second photoresist layer.

In the manufacturing method of the touch array substrate of the present disclosure, before forming the common electrode layer on the second photoresist layer includes following step:

Ashing the planarization layer to make a bottom surface of the second photoresist layer form a chamfer.

In the manufacturing method of the touch array substrate of the present disclosure, a second halftone photomask is used to perform an exposure process on the second photoresist layer.

Furthermore, the second halftone photomask includes a third light transmissive part and a fourth light transmissive part. A light transmittance rate of the third light transmissive part is greater than a light transmittance rate of the fourth light transmissive part. The light transmittance rate of the third light transmissive part is 100%. The third light transmissive part corresponds to the second via hole, the third via hole, and the fourth via hole which are pending to be formed, and the fourth light transmissive part corresponds to the touch electrode pending to be formed of the common electrode layer.

Compared to the touch array substrate of the prior art, the touch array substrate and the manufacturing method thereof of the present disclosure make the metal layer and the pixel electrode layer share one photomask to form the gate electrode, the touch signal line, the data line, and the pixel electrode, thereby saving processing steps and solving the technical problem of current touch array substrates having high production cost and long production periods.

BRIEF DESCRIPTION OF THE SEVERAL VIEWS OF THE DRAWINGS

To more clearly illustrate the technical solutions of the embodiments of the present disclosure, the accompanying figures of the present disclosure will be described in brief. The accompanying figures described below are only part of the embodiments of the present disclosure, from which figures those skilled in the art can derive further figures without making any inventive efforts.

DESCRIPTION OF SPECIFIC EMBODIMENTS OF THE INVENTION

Please refer to the accompanying drawings, same parts are denoted with the same reference numerals. Illustrated below is based on the exemplary specific embodiments of the present disclosure, and should not be regarded as limitation on other specific embodiments of the present disclosure which are not elaborated herein.

Figure 1:
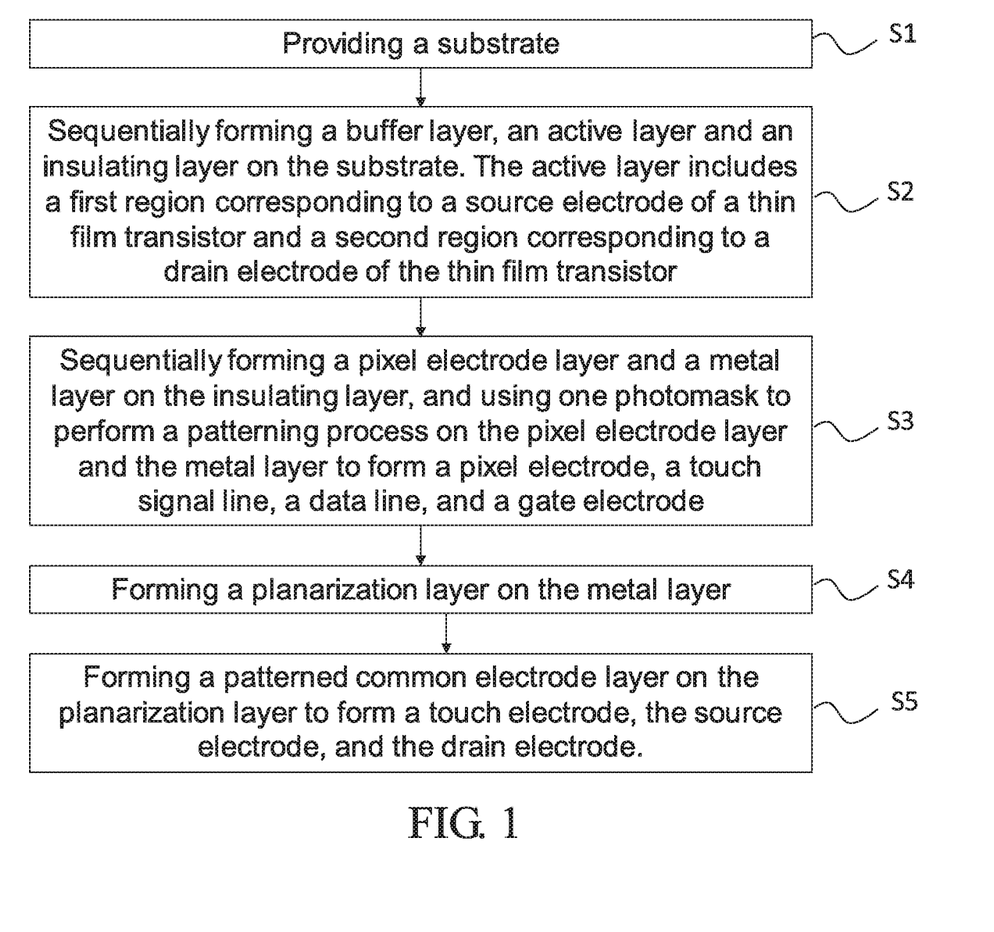
FIG. 1 is a flowchart of a manufacturing method of a touch array substrate of an embodiment of the present disclosure.
Figure 2:
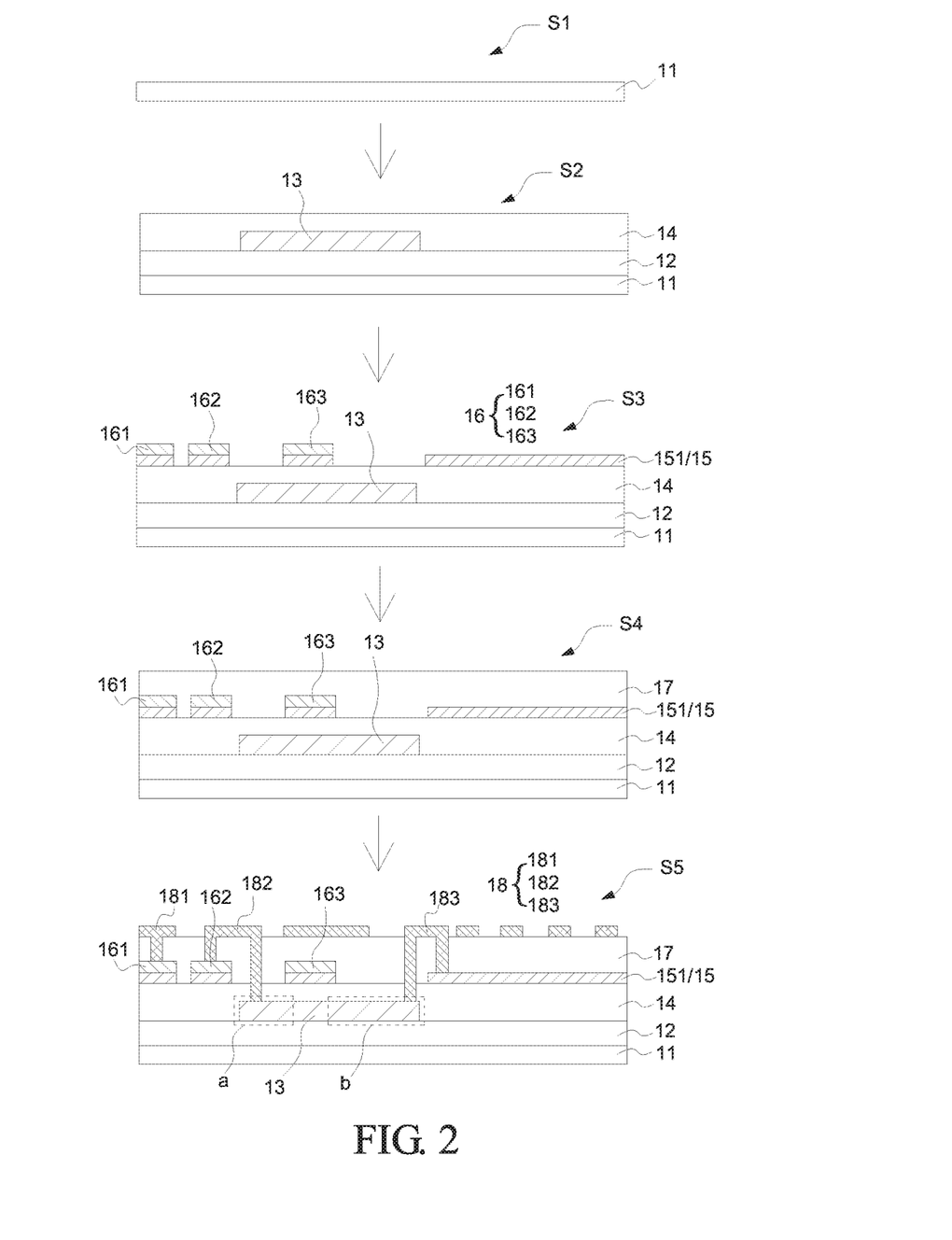
FIG. 2 is another flowchart of the manufacturing method of the touch array substrate of an embodiment of the present disclosure.

Please refer to FIG. 1 and FIG. 2. FIG. 1 is a flowchart of a manufacturing method of a touch array substrate of an embodiment of the present disclosure, and FIG. 2 is another flowchart of the manufacturing method of the touch array substrate of an embodiment of the present disclosure.

A manufacturing method of a touch array substrate of an embodiment of the present disclosure includes:

Step S1: providing a substrate.

Step S2: sequentially forming a buffer layer, an active layer, and an insulating layer on the substrate. Furthermore, the active layer includes a first region corresponding to a source electrode of a thin film transistor and a second region corresponding to a drain electrode of the thin film transistor.

Step S3: sequentially forming a pixel electrode layer and a metal layer on the insulating layer, and using one photomask to perform a patterning process on the pixel electrode layer and the metal layer to form a pixel electrode, a touch signal line, a data line, and a gate electrode.

Step S4: forming a planarization layer on the metal layer.

Step S5: forming a common electrode layer on the planarization layer to form a touch electrode, the source electrode, and the drain electrode. The touch electrode is connected to the touch signal line. An end of the source electrode is connected to the first region. Another end of the source electrode is connected to the data line. An end of the drain electrode is connected to the second region. Another end of the drain electrode is connected to the pixel electrode.

The manufacturing method of the touch array substrate of an embodiment of the present disclosure is elaborated as follow.

Step S1: providing a substrate 11. Then, go to step S2.

Step S2: sequentially forming a buffer layer 12, an active layer 13, and an insulating layer 14 on the substrate 11. The active layer 13 includes a first region a corresponding to a source electrode of a thin film transistor and a second region b corresponding to a drain electrode of the thin film transistor.

Specifically, forming the buffer layer 12 and an amorphous silicon layer on the substrate 11, performing a laser annealing process on the amorphous silicon layer to form a low-temperature polycrystalline-silicon layer, and then performing a modification process on the layer to form the active layer 13, after that, forming the insulating layer 14 on the active layer 13. The insulating layer 14 covers the buffer layer 12 and the active layer 13.

In this embodiment, one light shielding layer for shielding the active layer 13 is omitted. Because the light shielding layer is omitted, a part of a source/drain region of the active layer 13 needs to be adjusted to overcome a weak electricity generated after the active layer is illuminated. Then, go to step S3.

Step S3: sequentially forming the pixel electrode layer 15 and the metal layer 16 on the insulating layer 14, and using one photomask to perform a patterning process on the pixel electrode layer 15 and the metal layer 16 to form the pixel electrode 151, the touch signal line 161, the data line 162, and the gate electrode 163.

Figure 3:
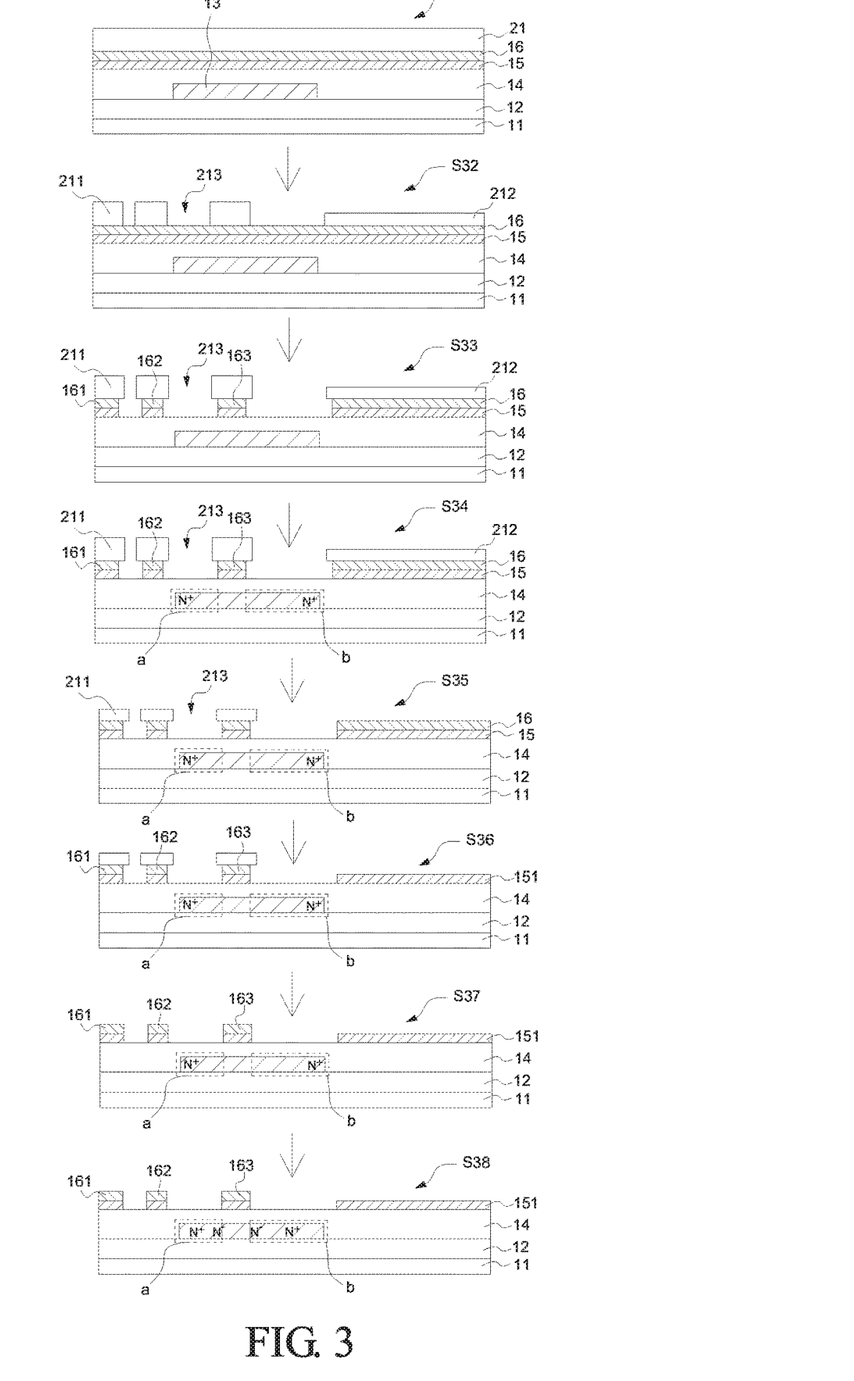
FIG. 3 is a flowchart of a step S3 of the manufacturing method of the touch array substrate of an embodiment of the present disclosure.

Specifically, please refer to FIG. 3. The step S3 includes:

Step S31: sequentially forming a pixel electrode layer 15, a metal layer 16, and a first photoresist layer 21 on the insulating layer 14.

Step S32: using a first halftone photomask to expose the first photoresist layer 21 to light, and then performing development on the first photoresist layer 21 to form a patterned first photoresist layer 21. The patterned first photoresist layer 21 includes a first part 211 corresponding to a gate electrode 163, a data line 162, and a touch signal line 161 which are in the metal layer 16 and are pending to be formed, a second part 212 corresponding to a pixel electrode 151 pending to be formed in the pixel electrode layer 15, and a first via hole 213 corresponding to the first region a and the second region b of the active layer 13. A thickness of the first part 211 is greater than a thickness of the second part 212.

Step S33: using the patterned first photoresist layer 21 to act as a mask to etch the metal layer 16 and the pixel electrode layer 15 to form the gate electrode 163, the data line 162, and the touch signal line 161.

Step S34: performing a heavy doping process on the first region a and the second region b of the active layer 13 through the first via hole 213.

Step S35: ashing the patterned first photoresist layer 21 to make the first part 211 thin and the second part 212 disappear.

Step S36: etching an exposed metal layer 16 to make the pixel electrode layer 15 form into the pixel electrode 151.

Step S37: removing a remaining first photoresist layer 21.

Step S38: performing a light doping process on the active layer 13.

Furthermore, when performing the doping process, using the first via hole 213 to act as a doping channel of the first region a and the second region b of the active layer 13. The first via hole 213 defines a doping range of the active layer 13, that is, using the patterned first photoresist layer 21 to define the heavy doping region of the active layer 13. When performing the light doping, after the first photoresist layer 21 is removed, using the patterned pixel electrode layer 15 and metal layer 16 to define the lightly doped region of the active layer 13.

Compared to the prior art, the adoption of one photomask to form the patterned pixel electrode layer 15 and the metal layer 16 not only omits an insulating layer between the pixel electrode layer and the metal layer, but also reduces processing steps and omits one photomask, thereby reducing the cost.

Figure 5:
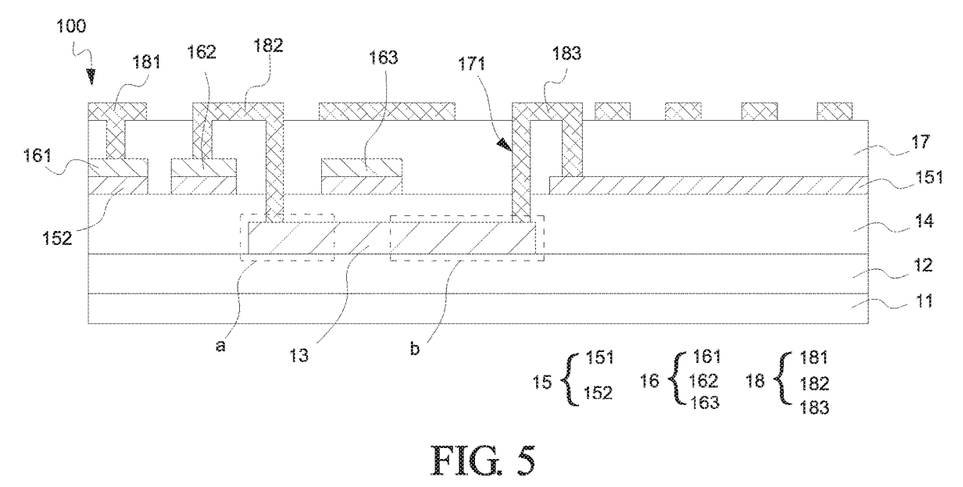
FIG. 5 is a structural schematic diagram of the touch array substrate of an embodiment of the present disclosure.
Figure 6:
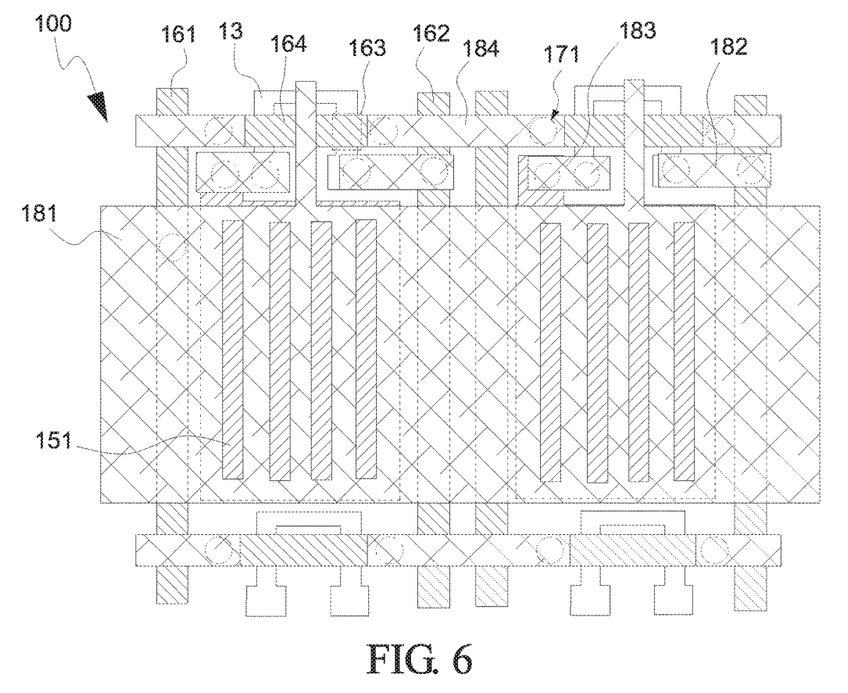
FIG. 6 is a top view structural schematic diagram of the touch array substrate of an embodiment of the present disclosure.

In addition, please refer to FIG. 5 and FIG. 6. Because the metal layer 16 is disposed on the pixel electrode layer 15, when forming the gate electrode 163, the data line 162, the touch signal line 161, and the gate line 164, the gate line 164, the gate electrode 163, the data line 162, and the touch signal line 161 cover a part of the pixel electrode layer 15. Furthermore, the part of the pixel electrode layer 15 is defined as a plurality of base layers. The gate electrode 163 and the gate line 164 are connected together and integrally formed, and extending directions of the two are consistent.

The plurality of base layers include a first base layer, a second base layer, and a third base layer. An extending direction of the first base layer is consistent with an extending direction of the touch signal line 161. An extending direction of the second base layer is consistent with an extending direction of the data line 162. An extending direction of the third base layer is consistent with an extending direction of the gate line 164. The touch signal line 161 is stacked on the first base layer. The data line 162 is stacked on the second base layer. The gate line 164 is stacked on the third base layer.

In the step S3, the first halftone photomask includes a first light transmissive part and a second light transmissive part. A light transmittance rate of the first light transmissive part is greater than a light transmittance rate of the second light transmissive part, and the light transmittance rate of the first light transmissive part is 100%. The first light transmissive part corresponds to the first via hole 213 pending to be formed, and the second light transmissive part corresponds to the pixel electrode 151 pending to be formed in the pixel electrode layer 15.

Then, go to step S4.

Step S4: forming the planarization layer on the metal layer 16. Specifically, forming the planarization layer 17 on the patterned metal layer 16. The planarization layer 17 covers the metal layer 16, the pixel electrode layer 15, and the insulating layer 14, and then hydrogen of the planarization layer 17 is used as a hydrogen source to perform a hydrogenation process on the active layer 13 correspondingly. Then, go to step S5.

Step S5: forming a patterned common electrode layer 18 on the planarization layer 17 to form a touch electrode 181, the source electrode 182, and the drain electrode 183.

The touch electrode 181 is connected to the touch signal line 161. An end of the source electrode 182 is connected to the first region a. Another end of the source electrode 182 is connected to the data line 162. An end of the drain electrode 183 is connected to the second region b, and another end of the drain electrode 183 is connected to the pixel electrode 151.

Figure 4:
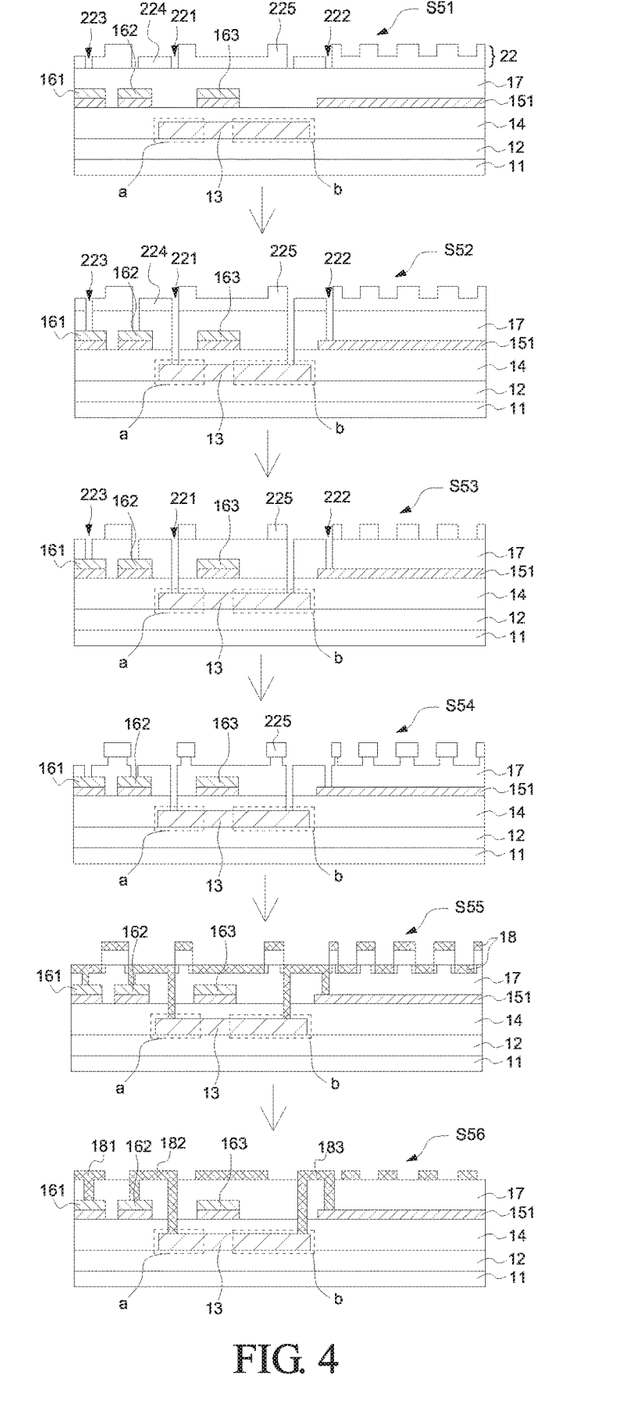
FIG. 4 is a flowchart of a step S5 of the manufacturing method of the touch array substrate of an embodiment of the present disclosure.

Specifically, please refer to FIG. 4, the step S5 includes:

S51: forming a second photoresist layer 22 on the planarization layer 17 and performing a patterning process on the second photoresist layer 22. A patterned second photoresist layer 22 includes a second via hole 221 corresponding to the first region a and the second region b of the active layer 13, a third via hole 222 corresponding to the pixel electrode 151, a fourth via hole 223 corresponding to the touch signal line 161 and the data line 162, a third part 224 corresponding to the touch electrode 181, the source electrode 182, and the drain electrode 183 of the common electrode layer 18 which are pending to be formed, and a fourth part 225 corresponding to a part of the common electrode 18 pending to be removed. A thickness of the third part 224 is less than a thickness of the fourth part 225.

S52: using the patterned second photoresist layer 22 to act as a mask to etch the planarization layer 17 to form the second via hole 221, the third via hole 222, and the fourth via hole 223.

S53: ashing the second photoresist layer 22 to remove the third part 224.

S54: ashing the planarization layer 17 to make a bottom surface of the second photoresist layer 22 form a chamfer.

S55: forming the common electrode layer 18 on the second photoresist layer 22.

S56: removing the second photoresist layer 22 and the common electrode layer 18 located on the second photoresist layer 22.

In some embodiments, the step S54 may be omitted. In the step S54 of this embodiment, the effect of the step is forming the chamfer on the bottom surface of the second photoresist layer 22. On one hand, this facilitates a quick disconnection of the part of the common electrode layer 18 on the fourth part 225 from the part on the planarization layer 17; on the other hand, this facilitates peel off of the second photoresist layer 22.

Please refer to FIG. 6, the patterned common electrode layer 18 further includes a connection line 184. The gate line 164 on each row is connected by the connection line 184.

In the step S41, the connection line 184 of the common electrode layer 18 pending to be formed also corresponds to the third part 224 of the second photoresist layer 22. (not shown in FIG. 4).

Furthermore, using a second halftone photomask to perform an exposure process on the second photoresist layer. The second halftone photomask includes a third light transmissive part and a fourth light transmissive part. A light transmittance rate of the third light transmissive part is greater than a light transmittance rate of the fourth light transmissive part. The light transmittance rate of the third light transmissive part is 100%. The third light transmissive part corresponds to the second via hole 221, the third via hole 222, and the fourth via hole 223 which are pending to be formed. The fourth light transmissive part corresponds to the touch electrode 181 pending to be formed of the common electrode layer 18.

The common electrode layer 18 is a transparent conductive layer. Optionally, a material of the transparent conductive layer is silver.

Thus, the manufacturing method of the touch array substrate of the present disclosure is finished.

Please refer to FIG. 5 and FIG. 6, the present disclosure further relates to a touch array substrate 100, which includes a substrate 11 and a buffer layer 12, an active layer 13, an insulating layer 14, a pixel electrode layer 15, a metal layer 16, a planarization layer 17, and a common electrode layer 18 sequentially disposed on the substrate 11.

The active layer 13 is disposed on the buffer layer 12. The active layer 13 includes a first region a corresponding to a source electrode of a thin film transistor and a second region b corresponding to a drain electrode of the thin film transistor.

The insulating layer 14 is disposed on the active layer 13 and covers the active layer 13 and the buffer layer 12.

The pixel electrode layer 15 is disposed on the insulating layer 14. The pixel electrode layer 15 includes a pixel electrode 151 and a plurality of base layers 152 disposed on a same layer as the pixel electrode 151.

The metal layer 16 is correspondingly stacked on the plurality of base layers 152 of the pixel electrode layer 15. The metal layer includes a touch signal line 161, a data line 162, a gate electrode 163, and a gate line 164.

The planarization layer 17 is disposed on the metal layer 16 and covers the metal layer 16, the pixel electrode 15, and the insulating layer 14.

The common electrode layer 18 is disposed on the planarization layer 17. The common electrode layer 18 includes a touch electrode 181, the source electrode 182, and the drain electrode 183. The touch electrode 181 is connected to the touch signal line 161. An end of the source electrode 182 is connected to the first region a, and another end of the source electrode 182 is connected to the data line 162. An end of the drain electrode 183 is connected to the second region b, and another end of the drain electrode 183 is connected to the pixel electrode 151.

Specifically, a plurality of via holes 171 are defined in the planarization layer 17. The touch electrode 181 is connected to the touch signal line 161 through the via holes 171. An end of the source electrode 182 is connected to the first region a through the via hole 171, and another end of the source electrode 182 is connected to the data line 162 through the via hole 171. An end of the drain electrode 183 is connected to the second region b through the via hole 171, and another end of the drain electrode 183 is connected to the pixel electrode 151 through the via hole 171.

The touch array substrate of the embodiments of the present disclosure is made to stack the metal layer 16 on the pixel electrode 15 and share one photomask in the processing, thereby reducing processing steps, saving a number of the photomask, and reducing the cost. Moreover, through a process of one photomask, the touch signal line 161, the data line 162, the gate electrode 163, the gate line 164, and the pixel electrode 151 are formed at one time. For the specific processing step, please refer to the step S3 of the manufacturing method of the touch array substrate mentioned above.

In the touch array touch 100 of an embodiment of the present disclosure, the gate electrode 163 and the gate line 164 are connected together and integrally formed. An extending direction of the gate line 164 is perpendicular to an extending direction of the data line 162, and the gate line 164 and the data line 162 are spaced apart.

Furthermore, the common electrode 18 further includes a plurality of connection lines 184. The gate line 164 on each row is connected by the connection lines 184. Specifically, an end of the connection lines 184 is connected to the gate line 164 through the via hole 171, and another end of the connection lines 184 is connected to another gate line 164 through the via hole 171.

In the touch array substrate 100 of an embodiment of the present disclosure, the plurality of base layers 152 include a first base layer, a second base layer, and a third base layer, and an extending direction of the first base layer is consistent with an extending direction of the touch signal line 161. An extending direction of the second base layer is consistent with an extending direction of the data line 162. An extending direction of the third base layer is consistent with an extending direction of the gate line 164.

The touch signal line 161 is stacked on the first base layer. The data line 162 is stacked on the second base layer. The gate line 164 is stacked on the third base layer.

For contents of the manufacturing method of the array substrate of the embodiments of the present disclosure, please refer to the contents of the manufacturing method of the array substrate mentioned above.

Compared to the touch array substrate of the prior art, the touch array substrate and the manufacturing method thereof of the present disclosure make the metal layer and the pixel electrode layer share one photomask to form the gate electrode, the touch signal line, the data line, and the pixel electrode, thereby saving processing steps and solving the technical problem of current touch array substrates having high production cost and long production periods.

In the above, for those of ordinary skill in the art, various other corresponding changes and modifications can be made according to the technical solutions and technical ideas of the present disclosure, and all such changes and modifications are intended to fall within the scope of protection of the claims of the present disclosure.

What is claimed is:

1. A touch array substrate, comprising a substrate and a buffer layer disposed on the substrate, wherein the touch array substrate comprises:
    an active layer disposed on the buffer layer, wherein the active layer comprises a first region corresponding to a source electrode of a thin film transistor and a second region corresponding to a drain electrode of the thin film transistor;
    an insulating layer disposed on the active layer and covering the active layer and the buffer layer;
    a pixel electrode layer disposed on the insulating layer, wherein the pixel electrode layer comprises a pixel electrode and a plurality of base layers disposed on a same layer as the pixel electrode;
    a metal layer correspondingly stacked on the plurality of base layers of the pixel electrode layer, wherein the metal layer comprises a touch signal line, a data line, a gate electrode, and a gate line;
    a planarization layer disposed on the metal layer and covering the metal layer, the pixel electrode, and the insulating layer; and
    a common electrode layer disposed on the planarization layer, wherein the common electrode layer comprises a touch electrode, the source electrode, and the drain electrode, the touch electrode is connected to the touch signal line, an end of the source electrode is connected to the first region, another end of the source electrode is connected to the data line, an end of the drain electrode is connected to the second region, and another end of the drain electrode is connected to the pixel electrode;
    wherein the gate electrode and the gate line are connected together and integrally formed, an extending direction of the gate line is perpendicular to an extending direction of the data line, and the gate line and the data line are spaced apart;
    wherein the common electrode layer comprises a plurality of connection lines, and the gate line on each row is connected by the plurality of connection lines;
    wherein the plurality of base layers comprise a first base layer, a second base layer, and a third base layer, an extending direction of the first base layer is consistent with an extending direction of the touch signal line, an extending direction of the second base layer is consistent with an extending direction of the data line, and an extending direction of the third base layer is consistent with an extending direction of the gate line; and wherein the touch signal line is stacked on the first base layer, the data line is stacked on the second base layer, and the gate line is stacked on the third base layer.

2. A touch array substrate, comprising a substrate and a buffer layer disposed on the substrate, wherein the touch array substrate comprises:

an active layer disposed on the buffer layer, wherein the active layer comprises a first region corresponding to a source electrode of a thin film transistor and a second region corresponding to a drain electrode of the thin film transistor;

an insulating layer disposed on the active layer and covering the active layer and the buffer layer;

a pixel electrode layer disposed on the insulating layer, wherein the pixel electrode layer comprises a pixel electrode and a plurality of base layers disposed on a same layer as the pixel electrode;

a metal layer correspondingly stacked on the plurality of base layers of the pixel electrode layer, wherein the metal layer comprises a touch signal line, a data line, a gate electrode, and a gate line;

a planarization layer disposed on the metal layer and covering the metal layer, the pixel electrode, and the insulating layer; and a common electrode layer disposed on the planarization layer, wherein the common electrode layer comprises a touch electrode, the source electrode, and the drain electrode, the touch electrode is connected to the touch signal line, an end of the source electrode is connected to the first region, another end of the source electrode is connected to the data line, an end of the drain electrode is connected to the second region, and another end of the drain electrode is connected to the pixel electrode.

3. The touch array substrate as claimed in claim 2, wherein the gate electrode and the gate line are connected together and are integrally formed, an extending direction of the gate line is perpendicular to an extending direction of the data line, and the gate line and the data line are spaced apart; and wherein the common electrode layer comprises a plurality of connection lines, and the gate line on each row is connected by the plurality of connection lines.

4. The touch array substrate as claimed in claim 2, wherein the plurality of base layers comprise a first base layer, a second base layer, and a third base layer, an extending direction of the first base layer is consistent with an extending direction of the touch signal line, an extending direction of the second base layer is consistent with an extending direction of the data line, and an extending direction of the third base layer is consistent with an extending direction of the gate line; and the touch signal line is stacked on the first base layer, the data line is stacked on the second base layer, and the gate line is stacked on the third base layer.

5. A manufacturing method of a touch array substrate, comprising following steps:

providing a substrate;

sequentially forming a buffer layer, an active layer, and an insulating layer on the substrate, wherein the active layer comprises a first region corresponding to a source electrode of a thin film transistor and a second region corresponding to a drain electrode of the thin film transistor;

sequentially forming a pixel electrode layer and a metal layer on the insulating layer, and using one photomask to perform a patterning process on the pixel electrode layer and the metal layer to form a pixel electrode, a touch signal line, a data line, and a gate electrode;

forming a planarization layer on the metal layer; and forming a patterned common electrode layer on the planarization layer to form a touch electrode, the source electrode, and the drain electrode, wherein the touch electrode is connected to the touch signal line, an end of the source electrode is connected to the first region, another end of the source electrode is connected to the data line, an end of the drain electrode is connected to the second region, and another end of the drain electrode is connected to the pixel electrode.

6. The manufacturing method of the touch array substrate as claimed in claim 5, wherein the step of sequentially forming the pixel electrode layer and the metal layer on the insulating layer, and using one photomask to perform the patterning process on the pixel electrode layer and the metal layer to form the pixel electrode, the touch signal line, the data line, and the gate electrode comprises:

sequentially forming the pixel electrode layer, the metal layer, and a first photoresist layer on the insulating layer;

using a first halftone photomask to expose the first photoresist layer to light, and then performing development on the first photoresist layer to form a patterned first photoresist layer, wherein the patterned first photoresist layer comprises a first part corresponding to the gate electrode, the data line, and the touch signal line of the metal layer which are pending to be formed, a second part corresponding to the pixel electrode pending to be formed in the pixel electrode layer, and a first via hole corresponding to the first region and the second region of the active layer, wherein a thickness of the first part is greater than a thickness of the second part;

using the patterned first photoresist layer to act as a mask to etch the gate electrode, the data line, and the touch signal line formed from the metal layer and the pixel electrode layer;

performing a heavy doping process on the first region and the second region of the active layer through the first via hole;

ashing the patterned first photoresist layer to make the first part thin and the second part disappear;

etching an exposed metal layer to make the pixel electrode layer form into the pixel electrode;

removing a remaining first photoresist layer; and performing a light doping process on the active layer.

7. The manufacturing method of the touch array substrate as claimed in claim 6, wherein the first halftone photomask comprises a first light transmissive part and a second light transmissive part, a light transmittance rate of the first light transmissive part is greater than a light transmittance rate of the second light transmissive part, the light transmittance rate of the first light transmissive part is 100%, the first light transmissive part corresponds to the first via hole pending to be formed, and the second light transmissive part corresponds to the pixel electrode pending to be formed in the pixel electrode layer.

8. The manufacturing method of the touch array substrate as claimed in claim 5, wherein before forming the patterned common electrode layer on the planarization layer comprises following step:

using hydrogen of the planarization layer to act as a hydrogen source to perform a hydrogenation process on the active layer correspondingly.

9. The manufacturing method of the touch array substrate as claimed in claim 6, wherein forming the patterned common electrode layer on the planarization layer comprises following steps:
   forming a second photoresist layer on the planarization layer and performing a patterning process on the second photoresist layer,
   wherein a patterned second photoresist layer comprises a second via hole corresponding to the first region and the second region of the active layer, a third via hole corresponding to the pixel electrode, a fourth via hole corresponding to the touch signal line and the data line, a third part corresponding to a touch electrode, a source electrode, and a drain electrode of the common electrode layer which are pending to be formed, and a fourth part corresponding to a part of the common electrode pending to be removed; and
   wherein a thickness of the third part is less than a thickness of the fourth part;
   using the patterned second photoresist layer to act as a mask to etch the planarization layer to form the second via hole, the third via hole, and the fourth via hole;
   ashing the second photoresist layer to remove the third part;
   forming the common electrode layer on the second photoresist layer; and
   removing the second photoresist layer and the common electrode layer located on the second photoresist layer.

10. The manufacturing method of the touch array substrate as claimed in claim 9, wherein before forming the common electrode layer on the second photoresist layer comprises following step:
   ashing the planarization layer to make a bottom surface of the second photoresist layer form a chamfer.

11. The manufacturing method of the touch array substrate as claimed in claim 9, wherein a second halftone photomask is used to perform an exposure process on the second photoresist layer;
   wherein the second halftone photomask comprises a third light transmissive part and a fourth light transmissive part, a light transmittance rate of the third light transmissive part is greater than a light transmittance rate of the fourth light transmissive part, the light transmittance rate of the third light transmissive part is 100%, the third light transmissive part corresponds to the second via hole, the third via hole, and the fourth via hole which are pending to be formed, and the fourth light transmissive part corresponds to the touch electrode pending to be formed of the common electrode layer.

12. The manufacturing method of the touch array substrate as claimed in claim 6, wherein the common electrode layer is a transparent conductive layer.

13. The manufacturing method of the touch array substrate as claimed in claim 12, wherein a material of the transparent conductive layer is silver.

* * * * *